United States Patent [19]
Kepler et al.

[11] Patent Number: 6,143,624
[45] Date of Patent: Nov. 7, 2000

[54] SHALLOW TRENCH ISOLATION FORMATION WITH SPACER-ASSISTED ION IMPLANTATION

[75] Inventors: Nick Kepler, Saratoga; Olov Karlsson; Larry Wang, both of San Jose, all of Calif.; Basab Bandyopadhyay, Austin, Tex.; Effiong Ibok, Sunnyvale; Christopher F. Lyons, Fremont, both of Calif.

[73] Assignee: Advanced Micro Devices, Inc., Sunnyvale, Calif.

[21] Appl. No.: 09/172,088

[22] Filed: Oct. 14, 1998

[51] Int. Cl.$^7$ .................................................. H01L 21/762
[52] U.S. Cl. ........................ 438/433; 438/426; 438/435; 438/766; 438/966; 438/981
[58] Field of Search ..................................... 438/433, 426, 438/424, 435, 766, 966, 981, FOR 451, FOR 262; 148/DIG. 50

[56] References Cited

U.S. PATENT DOCUMENTS

| | | |
|---|---|---|
| 4,693,781 | 9/1987 | Leung et al. |
| 4,923,821 | 5/1990 | Namose. |
| 6,001,707 | 12/1999 | Chih-Hung. |
| 6,063,694 | 5/2000 | Mitsuhiro. |

*Primary Examiner*—George Fourson

[57] ABSTRACT

An insulated trench isolation structure is formed by ion implanting impurities proximate the trench edges to enhance the silicon oxidation rate and, hence, increase the thickness of the resulting oxide at the trench edges. Embodiments include masking and etching a barrier nitride layer, forming protective spacers on portions of the substrate corresponding to subsequently formed trench edges, etching the trench, removing the protective spacers, ion implanting impurities into those portions of the substrate previously covered by the protective spacers, and then growing an oxide liner. The resulting oxide formed on the trench edges is thick due to the enhanced silicon oxidation rate, thereby avoiding overlap of a subsequently deposited polysilicon layer and breakdown problems attendant upon a thinned gate oxide at the trench edges.

24 Claims, 6 Drawing Sheets

SHALLOW TRENCH ISOLATION FORMATION WITH SPACER-ASSISTED ION IMPLANTATION

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. The quality and thickness of the gate oxide are crucial to the performance of the finished device.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the barrier nitride layer as a polish stop. In subsequent operations, the nitride and pad oxide are stripped off, and a gate oxide layer is grown on the exposed silicon of the substrate.

Disadvantageously, the gate oxide layer typically does not grow uniformly; i.e., it tends to be thinner at the trench edges where the gate oxide growth rate is smaller there to the curvature of the trench edges. The gate oxide grows at a decreased rate at the trench edges because silicon at the trench edges has a different crystallographic orientation than silicon at the main surface of the substrate. As a result of gate oxide thinning at the trench edges, the subsequently deposited polysilicon overlaps the trench edges. This is shown in FIG. 1, illustrating the substrate 1, trench edges 1a, liner oxide 2, insulating material 3, gate oxide 4 and polysilicon 5. The overlap of polysilicon undesirably results in polysilicon remaining in the trench after etching to form the gates. This residual polysilicon, along with the thin gate oxide at the trench edges, increases the electric field strength at the trench edges, leading to breakdown of the gate oxide, thereby decreasing device reliability.

There exists a continuing need for shallow trench isolation methodology wherein the resulting gate oxide layer at the trench edges exhibits high reliability and prevents the polysilicon layer from overlapping the trench edges.

SUMMARY OF THE INVENTION

An object of the present invention is a method of manufacturing a semiconductor device having a shallow trench isolation region and a gate oxide with high integrity.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a barrier nitride layer having an upper surface on the pad oxide layer; forming a mask having an opening on the barrier nitride layer; etching to remove a portion of the underlying barrier nitride layer to expose a portion of the pad oxide layer and to form an opening in the barrier nitride layer having a substantially vertical wall intersecting the pad oxide layer; depositing a protective layer on the barrier nitride layer and on the exposed portion of the pad oxide layer; anisotropically etching the protective layer to form a protective sidewall spacer on the substantially vertical wall of the barrier nitride layer and extending on the pad oxide layer; etching to form a trench in the substrate or epitaxial layer, which trench comprises side surfaces intersecting the main surface at edges; removing the protective spacer, thereby exposing portions of the main surface proximal to the edges; ion implanting impurities in the exposed portions of the main surface including the edges, thereby increasing the oxidation rate of the ion implanted portions; and forming an oxide liner on the side surfaces of the trench, on the edges, and on the exposed portions of the main surface in contact with the pad oxide layer, the oxide liner having a thickness on the main surface and proximal to the edges on the ion implanted portions greater than that of the remainder of the oxide liner.

Another aspect of the present invention is a method of manufacturing an integrated circuit, comprising: forming a silicon oxide pad layer on a main surface of a semiconductor substrate or an epitaxial layer formed on the substrate; forming a silicon nitride barrier layer having a thickness of about 1000 Å to about 2000 Å and having an upper surface on the silicon oxide pad layer; forming a photoresist mask having an opening on the silicon nitride barrier layer; etching to remove a portion of the underlying silicon nitride barrier layer to expose a portion of the silicon oxide pad layer and to form an opening in the silicon nitride barrier layer having a substantially vertical wall intersecting the silicon oxide pad layer, the substantially vertical wall having a height of about 1000 Å to about 2000 Å; depositing a conformal protective layer of silicon nitride or silicon dioxide derived from tetraethyl orthosilicate (TEOS) by low pressure chemical vapor deposition (LPCVD) on the silicon nitride barrier layer and on the exposed portion of silicon oxide pad layer to a thickness of about 200 Å to about 500 Å; anisotropically etching the protective layer to form a protective sidewall spacer on the substantially vertical wall of the silicon nitride barrier layer and extending on the silicon oxide pad layer, the protective spacer having a width of about 100 Å to about 500 Å; etching to form a trench in the substrate or epitaxial layer, which trench comprises side surfaces intersecting the main surface at edges; removing the protective spacer, thereby exposing portions of the main surface proximal to the edges; ion implanting boron, arsenic, silicon or phosphorus into the exposed portions of the main surface including the edges, at an energy of about 40 keV or less and at a dosage of up to about $1 \times 10^{15}$ atoms $cm^{-2}$; thermally growing a thin silicon oxide liner on the surface layer of the trench, on the edges, on the exposed portions of the main surface and in contact with the silicon oxide pad layer at a temperature of about 850° C. to about 1100° C., wherein the thickness of the silicon oxide liner on the main surface and on the implanted portions proximal to the edges is about 500 Å to about 800 Å greater than that of the remainder of the silicon oxide liner; depositing an insulating material to fill the trench and cover the silicon nitride barrier layer, the insulating material comprising silicon dioxide derived from tetraethyl orthosilicate (TEOS) by low pressure chemical vapor deposition (LPCVD), silicon dioxide derived from silane by LPCVD, or a high density plasma oxide; and planarizing by chemical-mechanical polishing such that an upper surface of the insulating material is substantially flush with the upper surface of the barrier nitride layer.

A still further aspect of the invention is a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a barrier nitride layer having an upper surface on the pad oxide layer; forming a mask having an opening on the barrier nitride layer; etching to remove a portion of the underlying barrier nitride layer to expose a portion of the pad oxide layer and to form an opening in the barrier nitride layer having a substantially vertical wall intersecting the pad oxide layer; depositing a protective layer on the barrier nitride layer and on the exposed portion of the pad oxide layer; anisotropically etching the protective layer to form a protective spacer on the substantially vertical wall of the barrier nitride layer and extending on the pad oxide layer; etching to form a trench in the substrate or epitaxial layer, which trench has a surface layer comprising side surfaces intersecting the main surface at edges; removing the protective spacer, thereby exposing portions of the main surface proximal to the edges; forming an oxide liner on the surface layer of the trench, on the edges, on the exposed portions of the main surface and in contact with the pad oxide layer; ion implanting impurities through the oxide liner and into a portion of the main surface including the edges, thereby increasing the oxidation rate of the ion implanted portions; depositing an insulating material to fill the trench and cover the barrier nitride layer; planarizing such that an upper surface of the insulating material is substantially flush with the upper surface of the barrier nitride layer; removing the barrier nitride layer and the pad oxide layer; and growing a gate oxide layer on the main surface and on the edges, the gate oxide layer having a thickness proximal to the edges which is greater than that of the remainder of the gate oxide layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1:
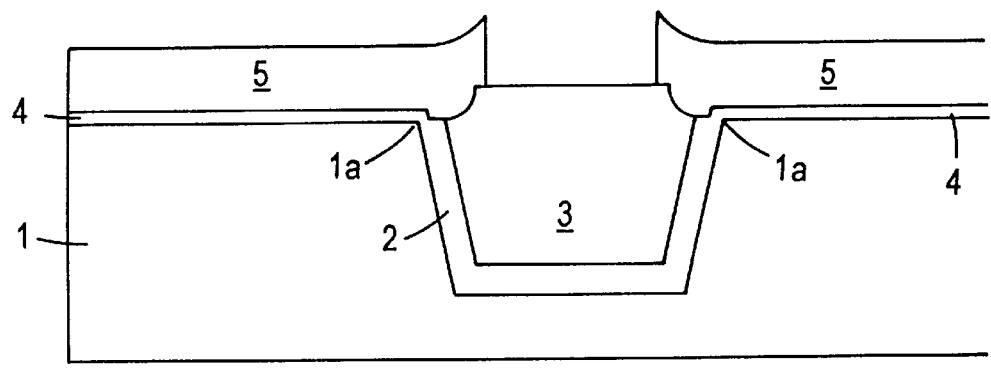
FIG. 1 schematically illustrates an STI structure with undesirably thinned gate oxide at the trench edges.

The present invention addresses and solves problems stemming from a characteristic reduction in the thickness of a gate oxide at the trench edges attendant upon conventional STI methodology. As a result, the quality of the gate oxide decreases with an attendant increase in the electric field strength at the trench edges, leading to early breakdown of the gate oxide, thereby decreasing the lifetime of the semiconductor device. The present invention addresses and solves such problems with methodology enabling the manufacture of a semiconductor device having a desirably thick oxide at the trench edges.

According to the methodology of an embodiment of the present invention, a photoresist mask is formed on a barrier nitride layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the barrier nitride layer is etched, forming an opening in the barrier nitride layer having substantially vertical walls, and exposing the pad oxide layer. A protective layer such as silicon nitride or silicon oxide is then deposited, as by low pressure chemical vapor deposition, on the barrier nitride layer and the exposed portions of the pad oxide layer. Next, the protective layer is anisotropically etched to form protective spacers on the walls of the barrier nitride layer and extending on the pad oxide layer.

The substrate is then etched to form a trench which intersects the main surface at edges. The protective spacers are removed, exposing portions of the main surface proximal to the edges. Impurities, such as boron, arsenic, silicon or phosphorus ion, are then implanted, as by ion implantation, into the main surface including the edges for increasing the oxidation rate of the impurity implanted portions. An oxide liner is grown on the trench surface, on the exposed main surface and on the edges in contact with the pad oxide. Due to the strategic implantation of impurities increasing the oxidation rate, the oxide liner grows much thicker at and proximate the trench edges and on the main surface than on the rest of the internal trench surface.

The trench is thereafter refilled with an insulating material, and the insulating material planarized, as by CMP. Subsequently, the pad oxide and barrier nitride layers are removed and a gate oxide layer is grown on the main surface of the substrate in contact with the thick oxide liner, followed by deposition of a polysilicon layer.

Since the inventive methodology advantageously provides a thick oxide liner on the trench edges, the gate oxide needs only to be grown on the substantially planar main surface of the substrate, which has a single crystallographic orientation. Thus, the gate oxide grows uniformly on the main surface, and is thick at the trench edges, avoiding the breakdown problems of conventional STI formation techniques attendant upon a reduction in thickness at the edges.

In another embodiment of the present invention, impurities are implanted in the main surface proximal to the trench edges following the formation of the oxide liner. In this way, implanted impurities are not lost from the substrate during formation of the oxide liner, thereby ensuring a greater oxidation rate enhancement during gate oxidation, resulting in a thicker gate oxide at the edges.

Figure 2A:
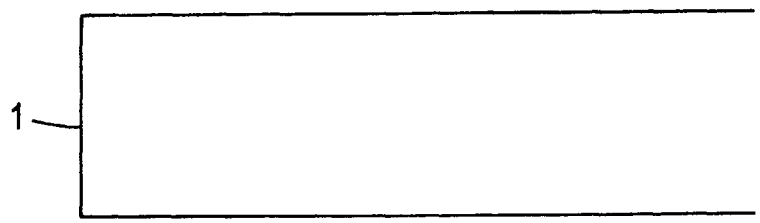
FIGS. 2A–2M schematically illustrate sequential phases of a method in accordance with a first embodiment of the present invention.

An embodiment of the present invention is illustrated in FIGS. 2A–2M, wherein sequential phases in forming a semiconductor device in accordance with the present invention are shown. Referring to FIG. 2A, a substrate 1 is prepared having a substantially planar surface, typically a semiconductor substrate comprising doped monocrystalline silicon or an epitaxial layer formed on a semiconductor substrate in accordance with conventional practices. A pad oxide layer 2 is then grown on the substrate 1. Pad oxide layer 2 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Figure 2B:
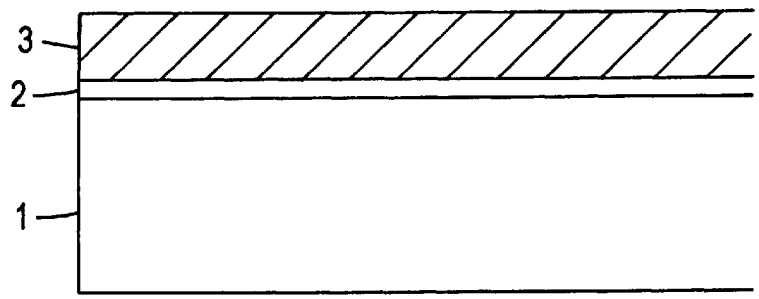

After formation of the pad oxide layer 2, a barrier nitride layer 3 is deposited on the pad oxide layer 2, as shown in FIG. 2B, such as a silicon nitride or silicon oxynitride layer by CVD, to a thickness of about 1000 Å to about 2000 Å. Silicon oxide pad layer 2 functions as a buffer layer cushioning stresses between substrate 1 and barrier nitride layer 3. Barrier nitride layer 3 functions as an oxidation mask as it is resistant to the diffusion of oxygen and water vapor therethrough, thereby preventing an oxidizing species from reaching the underlying silicon substrate, and also acts as a polish stop.

Figure 2C:
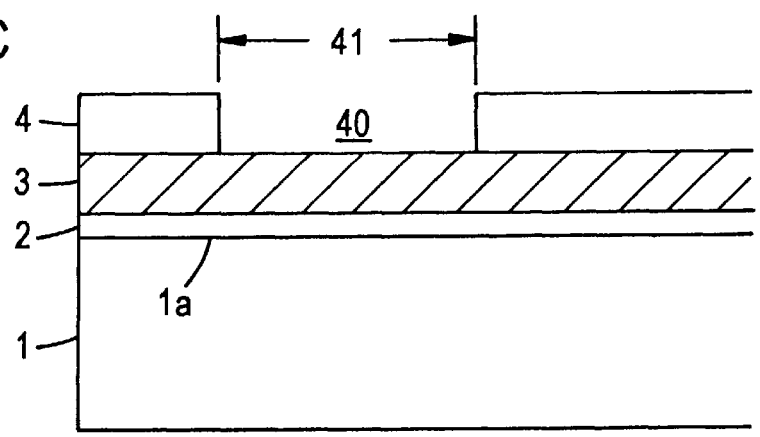
Figure 2D:
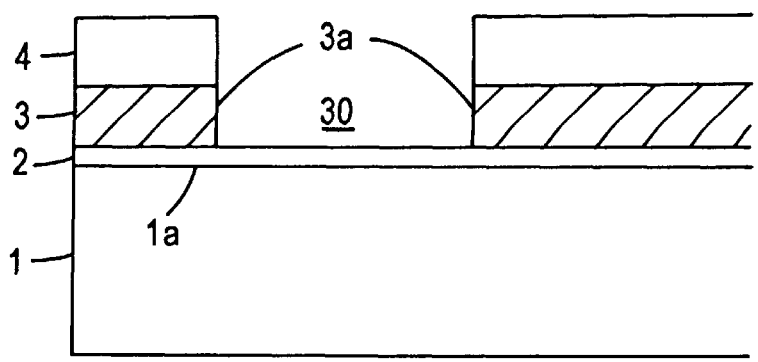

A photoresist mask 4 is then formed on barrier nitride layer 3, as shown in FIG. 2C. Photoresist mask 4 has a pattern defined by openings 40, which have a width 41 substantially corresponding to the width of the subsequently formed trench at the main surface 1a of the substrate 1, such as about 0.25 μ or less. The barrier nitride layer 3 is etched away, as depicted in FIG. 2D, to expose a portion of pad oxide layer 2 and to form an opening 30 in the barrier nitride layer 3 having substantially vertical walls 3a about 1000 Å to about 2000 Å in height. When the etching of barrier nitride layer 3 is completed, the photoresist 4 is stripped off the barrier nitride layer 3.

Figure 2E:
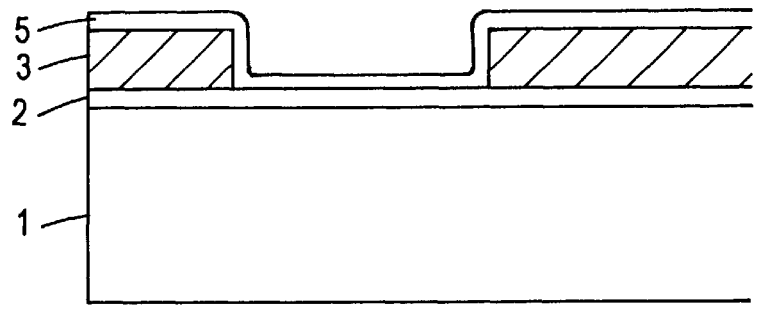
Figure 2F:
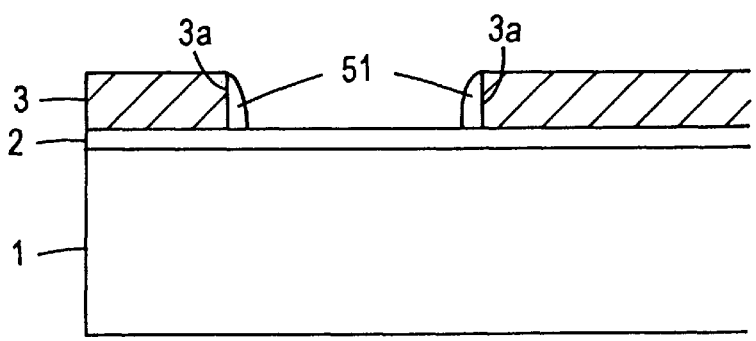

Thereafter, as depicted in FIG. 2E, a protective layer 5 is deposited to cover the barrier nitride layer 2 and the exposed portion of the pad oxide layer 2. The protective layer 5 is a conformal coating having a thickness of about 200 Å to about 500 Å, preferably comprising silicon dioxide derived from TEOS by LPCVD or derived from silane by LPCVD, or can comprise silicon nitride by CVD. The protective layer 5 is anisotropically etched to form protective sidewall spacers 51 on the substantially vertical walls 3a of the barrier oxide layer 3 and extending on the pad oxide layer 2 about 100 Å to about 500 Å, as shown in FIG. 2F.

Figure 2G:
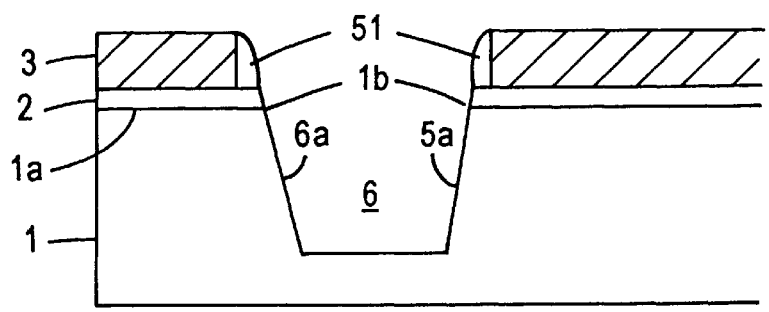
Figure 2H:
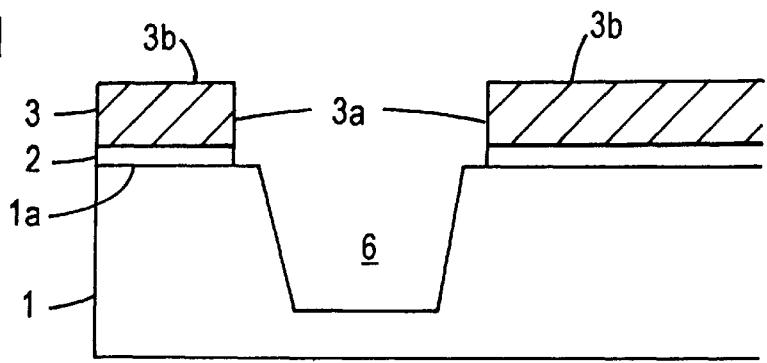

Subsequent to the formation of protective spacers 51, the unprotected portion of pad oxide layer 2 is etched away, and etching continues into the substrate 1 to form the shallow trench 6 having side surfaces 6a intersecting the main surface 1a at edges 1b, as shown in FIG. 2G. The trench 6 is typically etched to a depth of up to about 4000 Å. In practicing the present invention, a trench depth of about 2500 Å to about 3000 Å has been found particularly suitable. When etching is completed, the protective sidewall spacers 51 are removed, thereby forming a step between the upper surface 3b of the barrier nitride layer 3 and the main surface 1a of the substrate 1, as shown in FIG. 2H. The step is defined by the substantially vertical walls 3a of the barrier nitride layer 3.

Figure 2I:
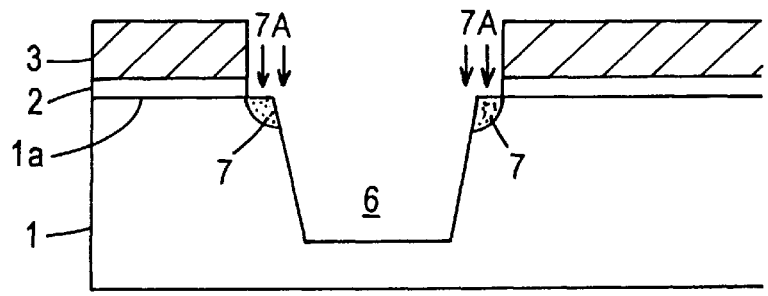

Following trench etching, impurities 7 are implanted, as indicated by arrows 7A in FIG. 2I, into a portion of the main surface 1a of the substrate 1. Suitable impurities 7 include those that enhance the oxidation rate of the ion implanted silicon substrate 1, such as boron, arsenic, silicon or phosphorus. N-type impurities have been found particularly suitable, because they enhance the oxidation rate of the substrate 1 to a greater degree than p-type impurities. Embodiments of the present invention include ion implanting n-type impurities into n-type impurity regions of substrate 1, and ion implanting p-type impurities into p-type impurity regions of substrate 1. Ion implantation is typically conducted at an energy of about 40 keV or less, and at a dosage of up to about $10^{15}$ atoms cm$^{-2}$.

Figure 2J:
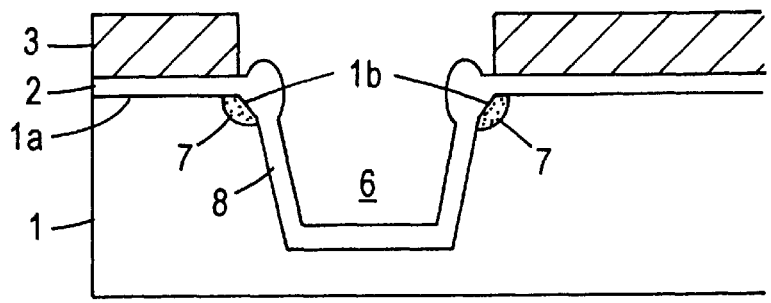

Thereafter, the trench surface is thermally oxidized, typically at a temperature of about 850° C. to about 1100° C., to form a silicon oxide liner 8 on the surface layer of trench 6, on the edges 1b, on the main surface 1a and in contact with the pad oxide layer 2. Due to the presence of impurities 7, which increase the silicon oxidation rate of implanted portions near and at the edges 1b and in the main surface 1a, the silicon oxide liner 8 has a thickness about 500 Å to about 800 Å greater proximal to the edges 1b and on the main surface 1a than at the remainder of the surface layer of the trench 6. FIG. 2J shows the trench 6 with the completed liner 8.

Figure 2K:
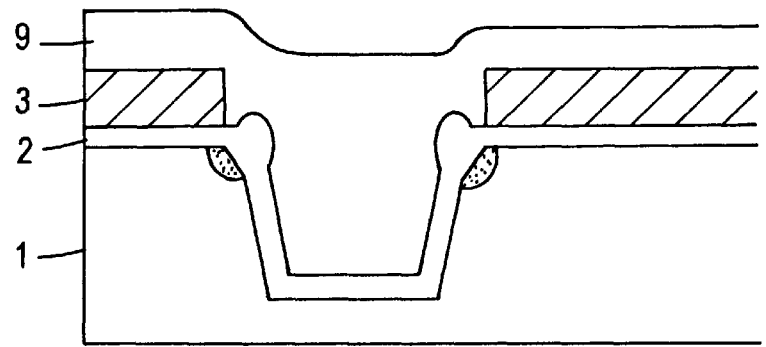
Figure 2L:
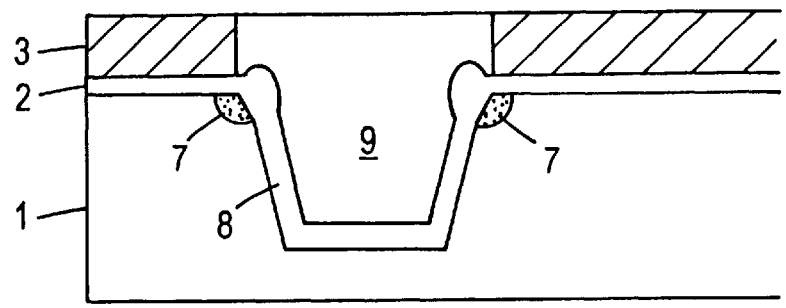

Subsequent to formation of silicon oxide liner 8, trench 6 is filled with a suitable insulating material 9, as shown in FIG. 2K. Such insulating material can comprise silicon dioxide derived from TEOS by LPCVD or derived from silane by LPCVD. The trench 7 can also be filled with a high density plasma (HDP) oxide, preferably employing the methodology disclosed in copending application Ser. No. 08/924,133, filed Sep. 5, 1997, the entire disclosure of which is hereby incorporated herein by reference. Subsequent to trench filling, planarization is effected, such as by CMP, as shown in FIG. 2L, to complete the STI structure.

Figure 2M:
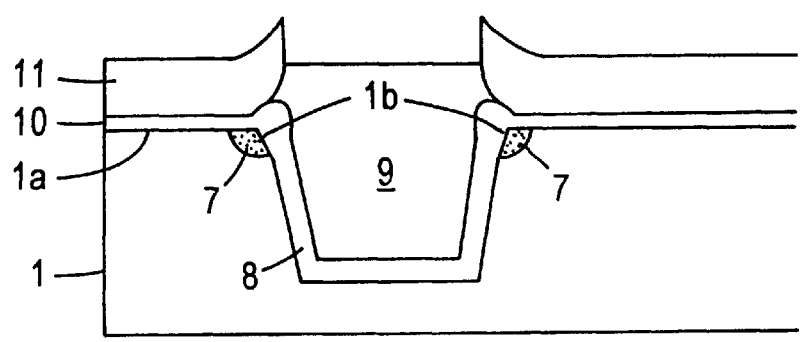

Thereafter, barrier nitride layer 3 and pad oxide layer 2 are removed, and gate oxide layer 10 is grown on the main surface 1a of substrate 1 in contact with oxide liner 8, as shown in FIG. 2M. Since the gate oxide 10 is grown only on the flat main surface 1a, which has a single crystallographic orientation, the gate oxide 10 grows uniformly, and the thick oxide liner 8 functions effectively as part of the gate oxide layer at the trench edges 1b.

Gate oxide growth is followed by deposition of polysilicon layer 11. Since the oxide liner 8 is relatively thick at the edges 1b, polysilicon 11 does not overlap the edge as shown in FIG. 1, thereby preventing polysilicon from encroaching into the trench after it is etched to form gates and avoiding an undesirable increase in the electric field strength at the trench edges.

Figure 3A:
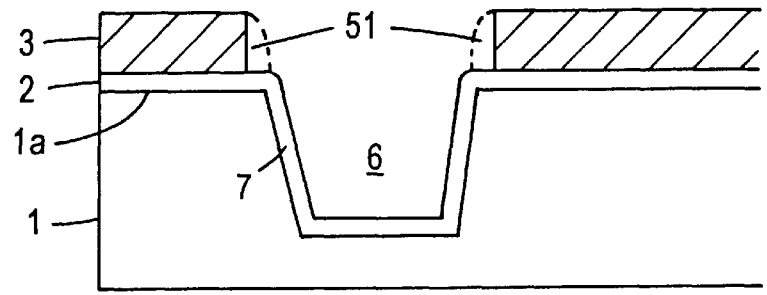
FIGS. 3A–3C schematically illustrate sequential phases of a method in accordance with a second embodiment of the present invention.
Figure 3B:
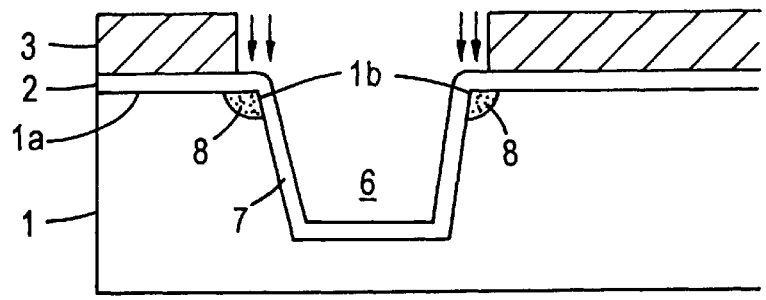
Figure 3C:
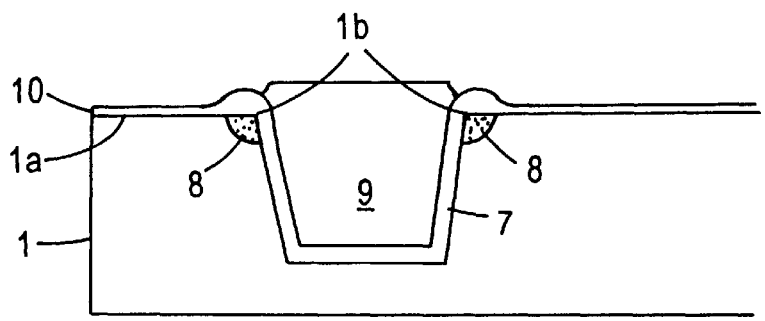

FIGS. 3A–3C depict sequential phases in forming a semiconductor device in accordance with another embodiment of the present invention. Referring to FIG. 3A, a pad oxide layer 2, barrier nitride layer 3, and spacers 51 are formed, then a trench 6 is formed and the spacers 51 are removed, as in the embodiment depicted in FIGS. 2A–2H. In this embodiment, oxide liner 7 is grown before ion implantation. As shown in FIG. 3B, the impurities 8 are implanted through the oxide liner 7 into the main surface 1a proximal to the edges 1b. After filling the trench 6, the insulating material 9 is planarized, the pad oxide 2 and barrier nitride layer 3 are removed, and a gate oxide layer 10 is grown, as depicted in FIG. 3C. Since the impurities 8 increase the oxide growth rate proximal to the edges 1b, resulting gate oxide layer 10 is thicker at the edges 1b than at the remainder of the main surface 1a.

The trench isolation formed in accordance with the present invention is characterized by gate oxide layers at the trench edges which are not thinned, but are relatively thick and exhibit high quality, with an attendant reduction in the overlap of subsequently deposited polysilicon at the trench edge, and a reduction in the electric field between the gate electrode and the substrate at the trench edges. As a result, the present invention advantageously avoids gate oxide breakdown and device failure. The present invention is applicable to the manufacture of various types of semiconductor devices having STI, particularly high density semiconductor devices having a design rule of about 0.25 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

forming a barrier nitride layer having an upper surface on the pad oxide layer;

forming a mask having an opening on the barrier nitride layer;

etching to remove a portion of the underlying barrier nitride layer to expose a portion of the pad oxide layer and to form an opening in the barrier nitride layer having a substantially vertical wall intersecting the pad oxide layer;

depositing a protective layer on the barrier nitride layer and on the exposed portion of the pad oxide layer;

anisotropically etching the protective layer to form a protective sidewall spacer on the substantially vertical wall of the barrier nitride layer and extending on a portion of the pad oxide layer;

etching to form a trench in the substrate or epitaxial layer, which trench comprises side surfaces intersecting the main surface at edges;

removing the protective spacer, thereby exposing portions of the main surface proximal to the edges;

ion implanting impurities in the exposed portions of the main surface including the edges, thereby increasing the oxidation rate of the ion implanted portions; and forming an oxide liner on the side surfaces of the trench, on the edges, and on the exposed portions of the main surface in contact with the pad oxide layer, the oxide liner having a thickness on the main surface and proximal to the edges on the ion implanted portions greater than that of the remainder of the oxide liner.

2. The method according to claim 1, wherein the pad oxide layer comprises silicon dioxide.

3. The method according to claim 1, wherein the width of the opening is about 0.25 $\mu$m or under.

4. The method according to claim 3, wherein the trench is etched to a depth of up to about 4000 Å.

5. The method according to claim 4, wherein the trench is etched to a depth of about 2500 Å to about 3000 Å.

6. The method according to claim 1, comprising implanting boron, arsenic, silicon or phosphorus ions.

7. The method according to claim 6, comprising implanting ions at an energy of about 40 keV or less.

8. The method according to claim 6, comprising implanting ions at a dosage up to about $1 \times 10^{15}$ atoms cm$^{-2}$.

9. The method according to claim 6, comprising implanting n-type ions into an n-type region.

10. The method according to claim 6, comprising implanting p-type ions into a p-type region.

11. The method according to claim 2, comprising heating at a temperature of about 850° C. to about 1100° C. to thermally grow a silicon oxide layer lining the trench.

12. The method according to claim 11, wherein the thickness of the silicon oxide liner proximal to the edges is about 500 Å to about 800 Å greater than that of the remainder of the silicon oxide liner.

13. The method according to claim 1, wherein the protective layer comprises silicon nitride or silicon dioxide derived from tetraethyl orthosilicate (TEOS) by low pressure chemical vapor deposition (LPCVD).

14. The method according to claim 13, wherein the protective layer is a conformal coating having a thickness of about 200 Å to about 500 Å.

15. The method according to claim 13, wherein the substantially vertical walls have a height of about 1000 Å to about 2000 Å.

16. The method according to claim 15, wherein the protective spacer has a width of about 100 Å to about 500 Å.

17. The method according to claim 1 comprising:
depositing an insulating material to fill the trench and cover the barrier nitride layer after forming the liner; and
planarizing such that an upper surface of the insulating material is substantially flush with the upper surface of the barrier nitride layer.

18. The method according to claim 17, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

19. A method of manufacturing an integrated circuit, comprising:
forming a silicon oxide pad layer on a main surface of a semiconductor substrate or an epitaxial layer formed on the substrate;
forming a silicon nitride barrier layer having a thickness of about 1000 Å to about 2000 Å and having an upper surface on the silicon oxide pad layer;
forming a photoresist mask having an opening on the silicon nitride barrier layer;
etching to remove a portion of the underlying silicon nitride barrier layer to expose a portion of the silicon oxide pad layer and to form an opening in the silicon nitride barrier layer having a substantially vertical wall intersecting the silicon oxide pad layer, the substantially vertical wall having a height of about 1000 Å to about 2000 Å;
depositing a conformal protective layer of silicon nitride or silicon dioxide derived from tetraethyl orthosilicate (TEOS) by low pressure chemical vapor deposition (LPCVD) on the silicon nitride barrier layer and on the exposed portion of silicon oxide pad layer to a thickness of about 200 Å to about 500 Å;
anisotropically etching the protective layer to form a protective sidewall spacer on the substantially vertical wall of the silicon nitride barrier layer and extending on the silicon oxide pad layer, the protective spacer having a width of about 100 Å to about 500 Å;
etching to form a trench in the substrate or epitaxial layer, which trench comprises side surfaces intersecting the main surface at edges;
removing the protective spacer, thereby exposing portions of the main surface proximal to the edges;
ion implanting boron, arsenic, silicon or phosphorus into the exposed portions of the main surface including the edges, at an energy of about 40 keV or less and at a dosage of up to about $1\times10^{15}$ atoms cm$^{-2}$;
thermally growing a thin silicon oxide liner on the surface layer of the trench, on the edges, on the exposed portions of the main surface and in contact with the silicon oxide pad layer at a temperature of about 850° C. to about 1100° C., wherein the thickness of the silicon oxide liner on the main surface and on the implanted portions proximal to the edges is about 500 Å to about 800 Å greater than that of the remainder of the silicon oxide liner;
depositing an insulating material to fill the trench and cover the silicon nitride barrier layer, the insulating material comprising silicon dioxide derived from tetraethyl orthosilicate (TEOS) by low pressure chemical vapor deposition (LPCVD), silicon dioxide derived from silane by LPCVD, or a high density plasma oxide; and
planarizing by chemical-mechanical polishing such that an upper surface of the insulating material is substantially flush with the upper surface of the barrier nitride layer.

20. A method of manufacturing a semiconductor device having an insulated trench formed in a semiconductor substrate or in an epitaxial layer on the semiconductor substrate, which method comprises:
forming a pad oxide layer on a main surface of the substrate or epitaxial layer;
forming a barrier nitride layer having an upper surface on the pad oxide layer;
forming a mask having an opening on the barrier nitride layer;
etching to remove a portion of the underlying barrier nitride layer to expose a portion of the pad oxide layer and to form an opening in the barrier nitride layer having a substantially vertical wall intersecting the pad oxide layer;
depositing a protective layer on the barrier nitride layer and on the exposed portion of the pad oxide layer;
anisotropically etching the protective layer to form a protective spacer on the substantially vertical wall of the barrier nitride layer and extending on the pad oxide layer;
etching to form a trench in the substrate or epitaxial layer, which trench has a surface layer comprising side surfaces intersecting the main surface at edges;
removing the protective spacer, thereby exposing portions of the main surface proximal to the edges;
forming an oxide liner on the surface layer of the trench, on the edges, on the exposed portions of the main surface and in contact with the pad oxide layer;
ion implanting impurities through the oxide liner and into a portion of the main surface including the edges, thereby increasing the oxidation rate of the ion implanted portions;
depositing an insulating material to fill the trench and cover the barrier nitride layer;
planarizing such that an upper surface of the insulating material is substantially flush with the upper surface of the barrier nitride layer;
removing the barrier nitride layer and the pad oxide layer; and
growing a gate oxide layer on the main surface and on the edges, the gate oxide layer having a thickness proximal to the edges which is greater than that of the remainder of the gate oxide layer.

21. The method according to claim 20, comprising implanting n-type ions into an n-type region.

22. The method according to claim 20, comprising implanting p-type ions into a p-type region.

23. The method according to claim 20, wherein the protective layer is a conformal coating having a thickness of about 200 Å to about 500 Å.

24. The method according to claim 23, wherein the substantially vertical walls have a height of about 1000 Å to about 2000 Å.

* * * * *